US 12,557,439 B2

(12) United States Patent
Lu et al.

(10) Patent No.: US 12,557,439 B2
(45) Date of Patent: Feb. 17, 2026

(54) QUANTUM DOTS COATED WITH BLUE-LIGHT ABSORPTION LAYER AND METHOD OF FORMING THE SAME

(71) Applicant: OPULENCE OPTRONICS CO., LTD., Hsinchu County (TW)

(72) Inventors: Yuan-Chang Lu, Hsinchu County (TW); Shang-Wei Chou, Hsinchu County (TW)

(73) Assignee: OPULENCE OPTRONICS CO., LTD., Hsinchu (TW)

( * ) Notice: Subject to any disclaimer, the term of this patent is extended or adjusted under 35 U.S.C. 154(b) by 370 days.

(21) Appl. No.: 18/314,500

(22) Filed: May 9, 2023

(65) Prior Publication Data
US 2023/0361243 A1 Nov. 9, 2023

Related U.S. Application Data

(60) Provisional application No. 63/339,638, filed on May 9, 2022.

(51) Int. Cl.
*H10H 20/812* (2025.01)
*H10H 20/01* (2025.01)
(Continued)

(52) U.S. Cl.
CPC ........ *H10H 20/812* (2025.01); *H10H 20/012* (2025.01); *H10H 20/84* (2025.01); *H10H 20/8512* (2025.01)

(58) Field of Classification Search
CPC .... H10H 20/812; H10H 20/012; H10H 20/84; H10H 20/8512
(Continued)

(56) References Cited

U.S. PATENT DOCUMENTS 11,499,095 B2 * 11/2022 Yang ...................... C09K 11/70
12,359,340 B2 * 7/2025 Schaefer ............... C23C 14/221
(Continued)

FOREIGN PATENT DOCUMENTS

CN 101901827 A 12/2010
CN 108384531 A 8/2018
(Continued)

OTHER PUBLICATIONS

Translation of CN 112779012, published 2021.*
(Continued)

*Primary Examiner* — Jami Valentine Miller
(74) *Attorney, Agent, or Firm* — Sughrue Mion, PLLC

(57) ABSTRACT

Provided is a light-emitting quantum dot coated with at least one blue-light absorption layer, including an alloy type core consisting of Cd, Se, Zn, and S, a first shell layer having a zinc blende structure and being coated on the surface of the alloy core, and at least one second shell layer having a wurtzite structure and being coated on a surface of the first shell layer, wherein the element ratio of each of Zn and S accounts for 30 to 50% of the overall core, and the content of Cd and Se gradually decreases outward from the core center. Also provided is a method for preparing the core-shell type light-emitting quantum dot. By having the aforementioned compositions and structures, the core-shell type quantum dot can achieve quantum efficiency of more than 95% and have high-temperature resistance and excellent water- and oxygen-barrier performance.

19 Claims, 27 Drawing Sheets

(51) Int. Cl.
*H10H 20/84* (2025.01)
*H10H 20/851* (2025.01)

(58) Field of Classification Search
USPC .......................................................... 257/79
See application file for complete search history.

(56) References Cited

U.S. PATENT DOCUMENTS

| | | | | |
|---|---|---|---|---|
| 2017/0373223 | A1* | 12/2017 | Kazama | .................... C30B 7/14 |
| 2019/0221257 | A1* | 7/2019 | Jeng | ................... G11C 13/0007 |
| 2020/0274026 | A1* | 8/2020 | Lu | ........................... C09K 11/56 |
| 2021/0024356 | A1* | 1/2021 | Cheng | ................. H10H 20/812 |
| 2023/0106112 | A1* | 4/2023 | Park | ....................... C09K 11/02 |
| | | | | 438/22 |
| 2023/0361243 | A1* | 11/2023 | Lu | ........................ H10H 20/812 |
| 2025/0043178 | A1* | 2/2025 | Peng | .................... C09K 11/883 |

FOREIGN PATENT DOCUMENTS

| | | | | |
|---|---|---|---|---|
| CN | 108822853 | A | | 11/2018 |
| CN | 109401754 | A | | 3/2019 |
| CN | 109988554 | A | | 7/2019 |
| CN | 110129055 | A | | 8/2019 |
| CN | 111117595 | A | | 5/2020 |
| CN | 112779012 | A * | 5/2021 | ........... C09K 11/883 |
| WO | 2019/153961 | A1 | | 8/2019 |

OTHER PUBLICATIONS

Office Action issued Jun. 27, 2024 in Chinese Patent Application No. 202310494887.3.

Office Action issued Jan. 24, 2024 in Taiwanese Patent Application No. 112116305.

* cited by examiner

Lattice of zinc blende structure

Lattice of wurtzite structure

QUANTUM DOTS COATED WITH BLUE-LIGHT ABSORPTION LAYER AND METHOD OF FORMING THE SAME

BACKGROUND

1. Technical Field

The present disclosure relates to a quantum dot and a preparation method thereof, and more particularly, to a light-emitting quantum dot including at least one blue-light absorption layer and a preparation method thereof.

2. Description of the Related Art

Quantum dots are nano-sized particles. Due to their size being smaller than twice the Bohr exciton radius of an electron, quantum confinement occurs, forming a discontinuous energy band. Accordingly, the quantum dot has the characteristic of spontaneous fluorescence after being stimulated. Such light and electrical characteristics caused by the special effect allow the quantum dot materials to be widely applied in the fields of light-emitting diodes, solar cells, photodetectors, liquid crystal displays, color enhancement films, color filters, and so on.

The existing quantum dot materials, however, have problems such as insufficient color purity and luminous efficiency due to the difficulty in controlling their dimensional uniformity. Furthermore, the existing quantum dots have insufficient resistance to temperature and insufficient water and oxygen barrier properties, which affect the stability of the applied device and limit the promotion and application of such materials.

Therefore, there lies a need for a light-emitting quantum dot with high luminous efficiency, high color purity, good barrier property for water as well as oxygen, and good temperature resistance.

SUMMARY

The present disclosure provides a core-shell type light-emitting quantum dot comprising: an alloy core that consists of Cd, Se, Zn, and S, wherein an element ratio of Zn and S each accounts for 30% to 50% of the overall core, and a content of Cd and Se gradually decreases outward from the core center; a first shell layer consisting of ZnS which has a zinc blende structure and is coated on a surface of the alloy core; and at least one second shell layer which has a wurtzite structure and is coated on a surface of the first shell layer.

In an embodiment of the present disclosure, a D90 particle size of the light-emitting quantum dot is 16 to 18 nm, and the alloy core has a radius of 3 nm or less.

In an embodiment of the present disclosure, the at least one second shell layer consists of Cd, Se, Zn, and S. In another embodiment of the present disclosure, a molar ratio of Cd:Se:Zn:S in the at least one second shell layer is from 1:20:6:3 to 1.2:28:12:6.

In an embodiment of the present disclosure, a molar ratio of Cd:Se:Zn:S in the light-emitting quantum dot is from 0.03:1:1:1 to 0.05:1.1:1.1:1.3. In another embodiment of the present disclosure, a molar ratio of Zn:S:Se in the light-emitting quantum dot is from 0.9:0.9:1 to 1.2:1.5:1.

In an embodiment of the present disclosure, the light-emitting quantum dot has an element ratio of Zn and Se each accounting for 25% to 40%, an element ratio of S accounting for 30% to 50%, and an element ratio of Cd accounting for 0.3% to 5% of the core-shell type light-emitting quantum dot. In this embodiment, the light-emitting quantum dot has an element ratio of Cd accounting for 0.3% to 3% of the core-shell type light-emitting quantum dot.

In an embodiment of the present disclosure, an element ratio of Cd and Se each accounts for 3% to 10% of the overall core.

The present disclosure further provides a method for preparing the core-shell type light-emitting quantum dot, comprising: providing a first metal precursor solution containing a Cd metal precursor and a Zn metal precursor and activated by a reactive amine; mixing and reacting a first ion stock solution containing S ions and Se ions with the activated metal precursor solution containing the Cd metal precursor and the Zn metal precursor to obtain a solution containing an alloy core; adding a second ion stock solution containing S ions and a zinc salt to the solution containing the alloy core for a reaction of forming a first shell layer coated on a surface of the alloy core; adding a second metal precursor solution containing a Cd metal precursor and a Zn metal precursor to the solution containing the alloy core coated with the first shell layer; mixing and reacting a third ion stock solution containing Se ions with the solution containing the alloy core coated with the first shell layer and the second metal precursor; and adding dodecanethiol to the solution containing the third ion stock solution to form a second shell layer coated on a surface of the first shell layer.

In an embodiment of the method of the present disclosure, the activated first metal precursor solution containing the Cd metal precursor and the Zn metal precursor is prepared by a process comprising activating the Cd metal precursor by the reactive amine and a reactive acid.

In an embodiment of the method of the present disclosure, the process further comprises: providing a first metal precursor solution containing the Cd metal precursor, wherein the Cd metal precursor is activated in the first metal precursor solution containing the Cd metal precursor by the reactive amine and the reactive acid; and adding the Zn metal precursor to the activated first metal precursor solution containing the Cd metal precursor to activate the Zn metal precursor at a temperature of from 300° C. to 320° C.

In an embodiment of the method of the present disclosure, the process further comprises: providing the first metal precursor solution containing the Cd metal precursor and the Zn metal precursor, wherein the Cd metal precursor is activated in the first metal precursor solution containing the Cd metal precursor and the Zn metal precursor by the reactive amine and the reactive acid; and heating the activated first metal precursor solution containing the Cd metal precursor and the Zn metal precursor to a temperature of from 300° C. to 320° C. to activate the Zn metal precursor.

In an embodiment of the method of the present disclosure, the reactive acid is oleic acid, and the reactive amine is a primary amine. In this embodiment of the method of the present disclosure, the reactive amine and the reactive acid have a molar ratio of from 1:7 to 1:7.5. In another embodiment of the method of the present disclosure, the primary amine is selected from a group consisting of oleylamine, hexadecanamine, pentadecylamine, and dodecylamine.

In an embodiment of the method of the present disclosure, the process further comprises: activating the Cd metal precursor and the Zn metal precursor in the second metal precursor solution by heating to a temperature of from 180° C. to 240° C. for 10 to 30 minutes. In another embodiment of the method of the present disclosure, the second metal precursor solution further contains oleic acid, and the Cd metal precursor and the Zn metal precursor are dissolved in oleic acid.

In an embodiment of the method of the present disclosure, the activated second metal precursor solution is heated to a temperature of 270° C. to 310° C. before mixing the third ion stock solution.

In an embodiment of the method of the present disclosure, a nitrogen purge process utilizing $N_2$ is performed during the activation of the Cd metal precursor and the Zn metal precursor.

In an embodiment of the method of the present disclosure, the solution containing the alloy core is obtained at a reaction temperature of from 280° C. to 310° C. for 10 to 20 minutes.

In an embodiment of the method of the present disclosure, adding the second ion stock solution containing the S ions and the zinc salt further comprises: adding the second ion stock solution containing the S ions to the solution containing the alloy core for 15 to 20 minutes; and adding the zinc salt to react for 20 to 30 minutes.

In an embodiment of the method of the present disclosure, the zinc salt is zinc oleate.

In an embodiment of the method of the present disclosure, the first shell layer is formed at a reaction temperature of from 240° C. to 270° C., and the second shell layer is formed at a reaction temperature of 270° C. to 310° C.

In an embodiment of the method of the present disclosure, the Cd metal precursor, the Zn metal precursor, the S ions and the Se ions for obtaining the solution containing an alloy core are in a molar ratio of from 0.14:5.9:4.2:1.5 to 1:5.9:4.2:1.5.

In an embodiment of the method of the present disclosure, the reactive amine, the Cd metal precursor, and the Zn metal precursor for forming the alloy core coated with the first shell layer are in a molar ratio of from 3:0.14:5.9 to 3:1:5.9

In an embodiment of the method of the present disclosure, the Cd metal precursor, the Zn metal precursor, the dodecanethiol, and the Se ions used for forming the second shell layer are in a molar ratio of from 0.65:5.4:50:24 to 1.3:10.8:70:48.

In an embodiment of the method of the present disclosure, the Cd metal precursor is at least one selected from CdO and $Cd(ac)_2$. The Zn metal precursor is at least one selected from ZnO and $Zn(ac)_2$.

Based on the preparation method of the present disclosure, a core-shell type light-emitting quantum dot with a shell layer having a wurtzite structure and consisting of Cd, Se, Zn, and S, which provides effective protection to the alloy core, improving the stability of the core-shell type light-emitting quantum dot and prolonging its service life. Moreover, the second shell layer with wurtzite structure formed on the surface of the core-shell type light-emitting quantum dot may increase the absorbance of blue light and has high-temperature resistance and excellent water- and oxygen-barrier performance. Further, the core-shell type light-emitting quantum dot having the second shell layer with wurtzite structure may have lower FWHM, which improves color performance and the luminous color purity of the quantum dot.

BRIEF DESCRIPTION OF THE DRAWINGS

The embodiments of the present disclosure are described by way of examples with reference to the accompanying drawings.

DETAILED DESCRIPTION OF THE PREFERRED EMBODIMENTS

The following is a description of specific embodiments for the present disclosure. Those skilled in the art can easily understand the advantages and effects of the present disclosure from the content disclosed in this specification. The present disclosure can also be implemented or applied by other different embodiments, and various details in this specification can also be given different modifications and changes based on different viewpoints and applications, without departing from the spirit disclosed by the present disclosure. In addition, all ranges and values herein are inclusive and combinable. Any value or point that falls within the range described herein. For example, any integer can be used as the minimum or maximum value to derive the lower range.

Figure 1A:
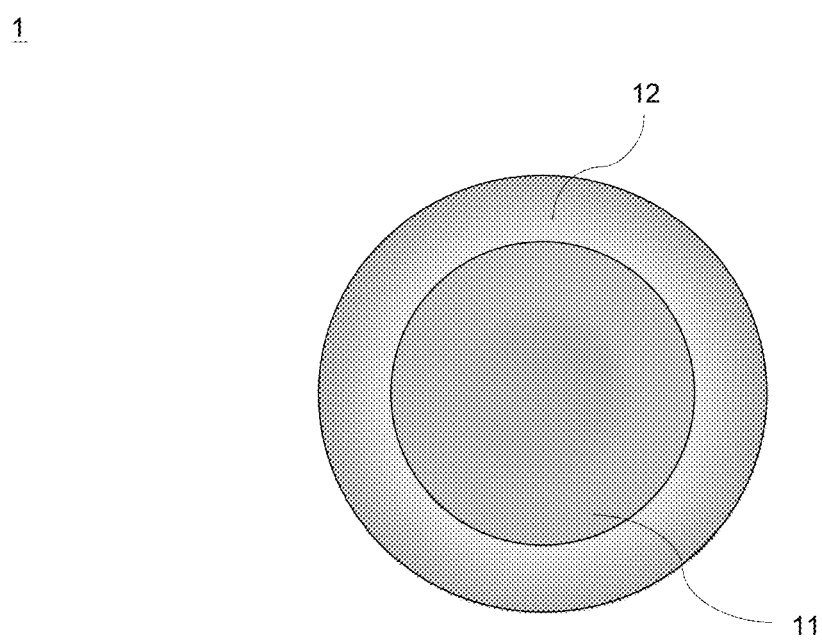
FIG. 1A is a schematic diagram showing the structure of the light-emitting quantum dot of the prior art.

Referring to FIG. 1A, which is a schematic diagram of the structure of the light-emitting quantum dot of the prior art. The light-emitting quantum dot 1 includes: an alloy core 11 composed of Cd, Se, Zn, and S, the element ratio of Zn and S each accounts for 30% to 50% of the overall core, and the content of Cd and Se gradually decreases outward from the core center; and a shell layer 12, which has a zinc blende structure and is coated on the surface of the light-emitting core.

Figure 1B:
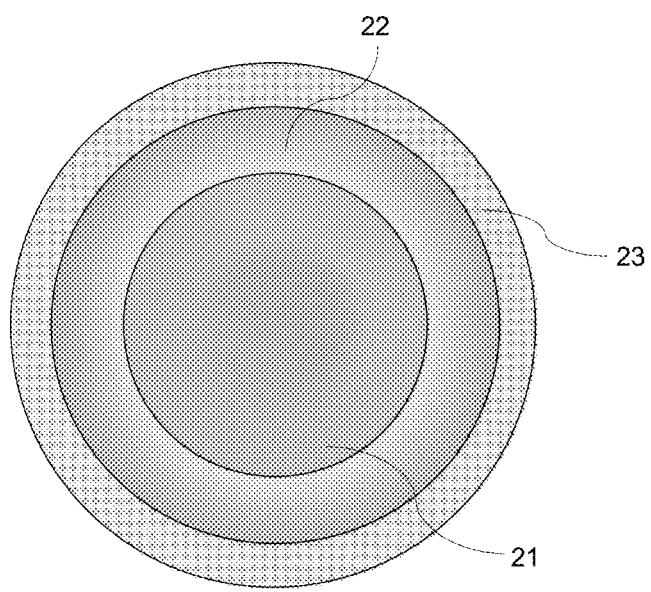
FIG. 1B is a schematic diagram showing the structure of the core-shell type light-emitting quantum dot of an embodiment of the present disclosure.
Figure 1C:
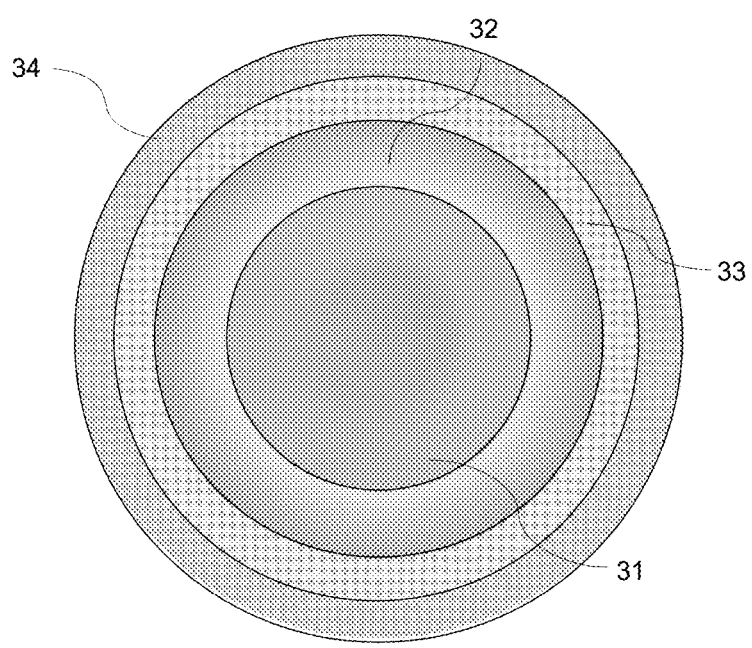
FIG. 1C is a schematic diagram showing the structure of the core-shell type light-emitting quantum dot of another embodiment of the present disclosure.

FIGS. 1B and 1C show the structure of the core-shell type light-emitting quantum dot of different embodiments of the present disclosure. Referring to FIG. 1B, the core-shell type light-emitting quantum dot 2 includes: an alloy core 21 composed of Cd, Se, Zn, and S each accounts for 30% to 50% of the overall core, and the content of Cd and Se gradually decreases outward from the core center; a first shell layer 22, which consists of ZnS and is coated on the surface of the light-emitting core; and a second shell layer 23, which has a wurtzite structure and is coated on a surface of the first shell layer 22. Further referring to FIG. 1C, the core-shell type light-emitting quantum dot 3 includes: an alloy core 31 composed of Cd, Se, Zn, and S, the element ratio of Zn and S each accounts for 30% to 50% of the overall core, and the content of Cd and Se gradually decreases outward from the core center; a first shell layer 32, which consists of ZnS and is coated on the surface of the light-emitting core; a second shell layer 33, which has a wurtzite structure and is coated on a surface of the first shell layer 32; and another second shell layer 34, which has a wurtzite structure and is coated on a surface of the second shell layer 33.

The features and effects of the present disclosure are further described in detail through the following specific embodiments. It shall be understood that the scope of the present disclosure is not limited by the description of the embodiments.

Comparative Example 1

To a first metal precursor solution containing 0.14 millimoles (mmol) of Cd, 1 milliliter (ml) of oleylamine and 7 ml of oleic acid were added, and the Cd metal precursor was activated at a temperature of 310° C.

Next, 2.9 mmol of Zn metal precursor was added to the activated Cd metal precursor solution, and the Zn metal precursor was activated at a temperature of 310° C.

In addition, a first ion stock solution having 2.2 mmol of S, 1.5 mmol of Se, and 3 ml of trioctylphosphine (TOP) was prepared. Subsequently, under a temperature condition of 280° C. to 310° C., the first ion reserve solution was fed into the activated Cd and Zn metal precursor-containing solution for a reaction. After 10 to 20 minutes of reaction, a solution containing an alloy light-emitting core particle was formed.

Further, a second ion stock solution having 2 mmol of S and 1 ml of TOP was prepared, and then the second ion stock solution was fed into the above-mentioned solution containing the alloy core under a temperature condition of 240° C. to 270° C. to react for 15 to 20 minutes.

After 15 to 20 minutes of reaction, 3 mmol of zinc oleate was added at a temperature condition of 240° C. to 270° C., and the reaction continues for 20 to 30 minutes, thereby obtaining a light-emitting quantum dot having the CdSeZnS alloy core and the shell layer with ZnS zinc blende structure.

Example 1

The preparation method in this example is the same as in Comparative Example 1, except that this example further includes a process of forming a second shell layer on the surface of the first shell layer.

A second metal precursor solution containing 0.65 millimoles (mmol) of Cd and 0.54 mmol of Zn dissolved in 11 mmol of oleic acid was added to the solution containing the light-emitting quantum dot having the CdSeZnS alloy core and the shell layer with ZnS. The second metal precursor solution was activated at a temperature of 240° C. under a nitrogen purge process utilizing $N_2$ for 10 to 20 minutes.

Further, a third ion stock solution having 0.024 moles mole of Se, and 0.053 moles mole of TOP was prepared, and then the third ion stock solution was fed into the above-mentioned solution containing the light-emitting quantum dot and the second metal precursor under a temperature of 270° C. to 310° C. to react for 10 to 30 minutes.

After 10 to 30 minutes of reaction, 0.05 mole of dodecanethiol was added at a temperature of 270° C. to 310° C., and the reaction continues for 10 to 30 minutes, thereby obtaining a core-shell type light-emitting quantum dot having the CdSeZnS alloy core, the first shell layer with ZnS, and the second shell layer with CdSeZnS wurtzite structure.

Example 2

The preparation method in this example is the same as in Example 1, except that this example further includes a process of forming another second shell layer on the surface of the second shell layer. That is to say, the core-shell type light-emitting quantum dot obtained in Example 2 has the CdSeZnS alloy core, the first shell layer with ZnS, and two second shell layers with CdSeZnS wurtzite structure.

Figure 2A:
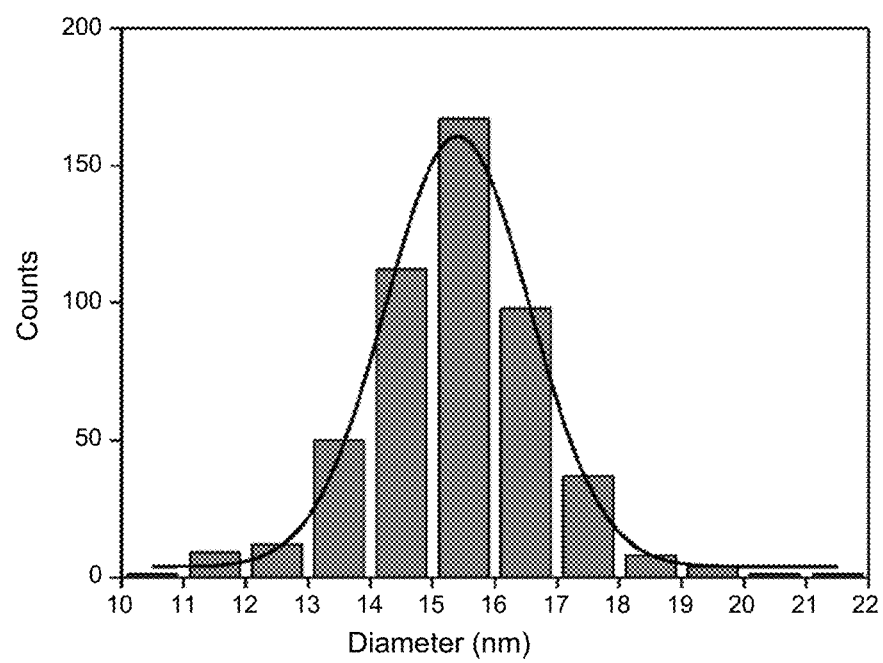
FIGS. 2A-2C are diagrams showing the particle size distribution of the light-emitting quantum dot according to Comparative Example 1 and the core-shell type light-emitting quantum dots according to Examples 1 and 2 of the present disclosure, respectively.
Figure 2B:
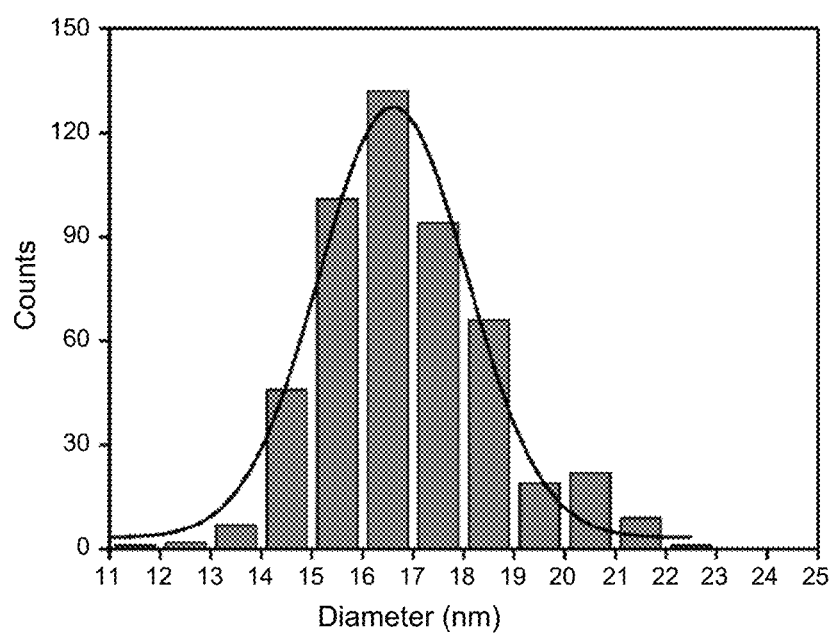
Figure 2C:
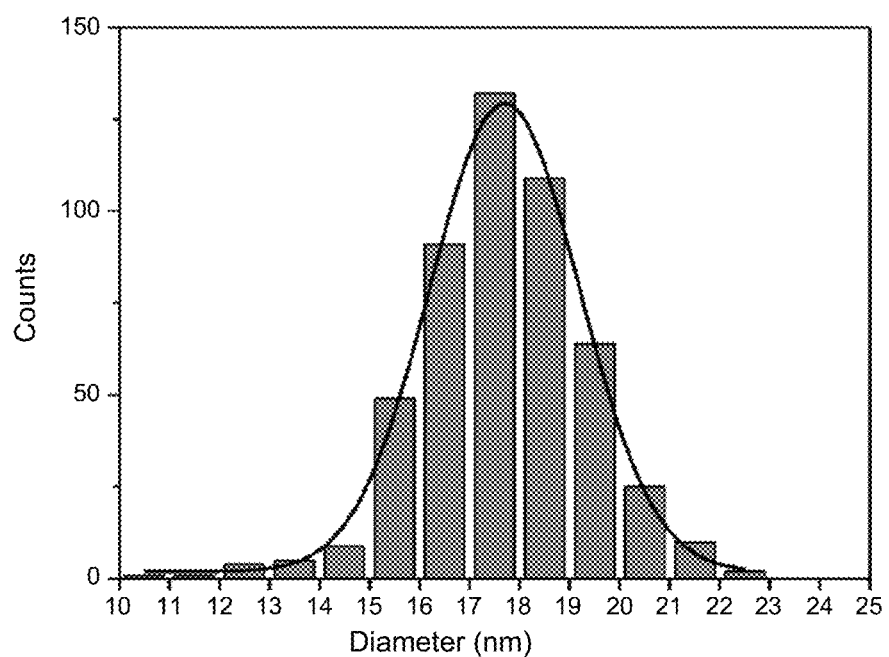

The particle size analyzer was used to analyze the light-emitting quantum dots prepared above. As shown in FIGS. 2A-2C, the D90 particle size of the light-emitting quantum dot of Comparative Example 1 was 15.4 nm, and the standard deviation of the average particle size was 1.43 nm; the D90 particle size of the light-emitting quantum dot of Example 1 was 16.8 nm, and the standard deviation of the average particle size was 1.70 nm; and the D90 particle size of the light-emitting quantum dot of Example 2 was 17.6 nm, and the standard deviation of the average particle size was 1.61 nm.

Figure 3A:
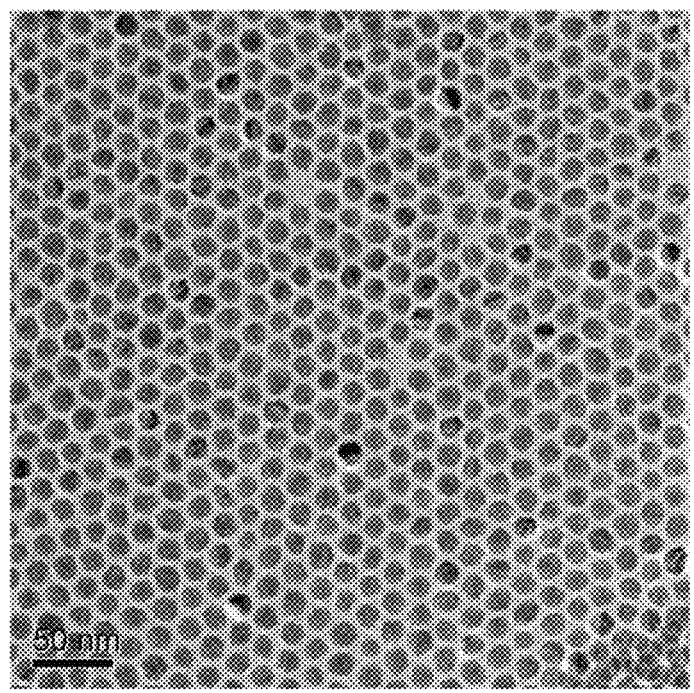
FIGS. 3A-3C show images of the light-emitting quantum dot according to Comparative Example 1 and the core-shell type light-emitting quantum dots according to Examples 1 and 2 of the present disclosure, respectively, which are observed by a high-resolution transmission electron microscope (HRTEM), respectively.
Figure 3B:
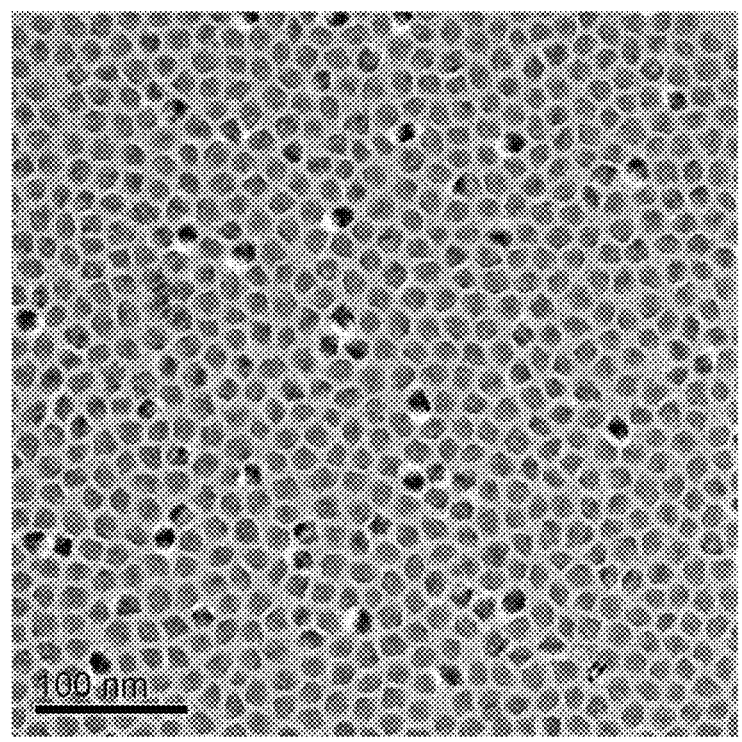
Figure 3C:
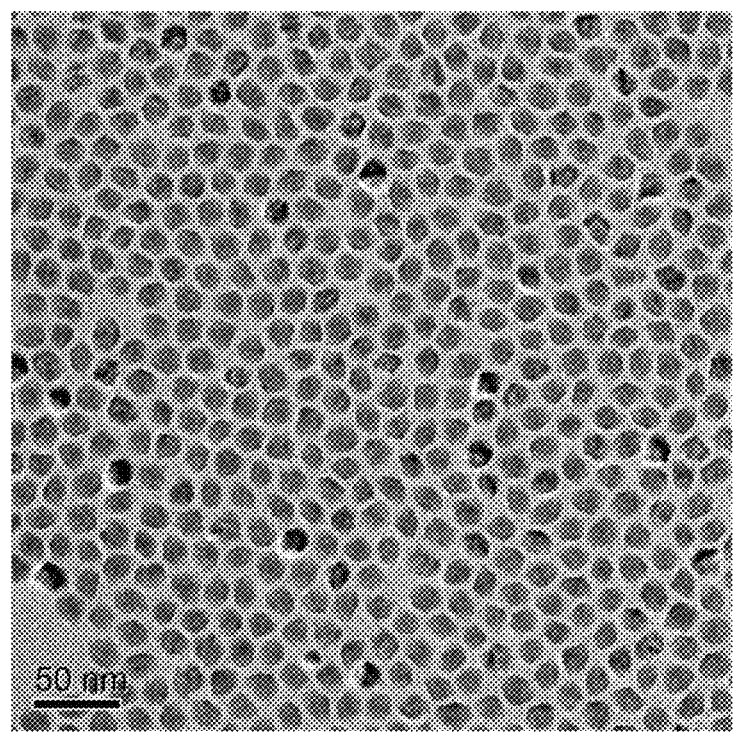

The light-emitting quantum dot of Comparative Example 1 and the core-shell type light-emitting quantum dots of Examples 1 and 2 were observed through a high-resolution transmission electron microscope (HRTEM). As shown in FIG. 3A, the appearance of the light-emitting quantum dot of Comparative Example 1 was a polygon with a plurality of corners. Referring to FIGS. 3B and 3C, the appearance of the core-shell type light-emitting quantum dots of Examples 1 and 2 were in an irregular shape.

Figure 4A:
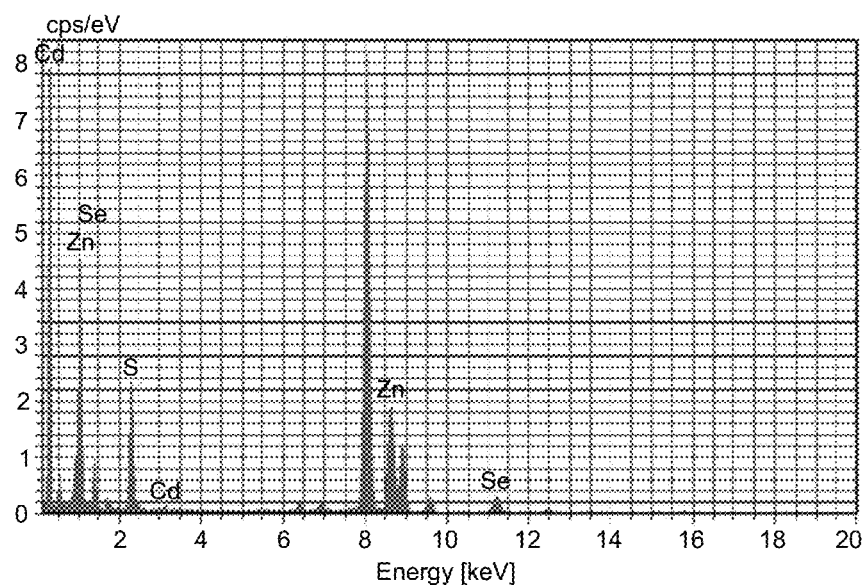
FIGS. 4A-4C are diagrams showing elements of sulfur, zinc, selenium, and cadmium in the overall light-emitting quantum dot according to Comparative Example 1 and the overall core-shell type light-emitting quantum dots according to Examples 1 and 2 of the present disclosure, respectively, which are analyzed by an energy-dispersive X-ray spectroscopy (EDS)
Figure 4B:
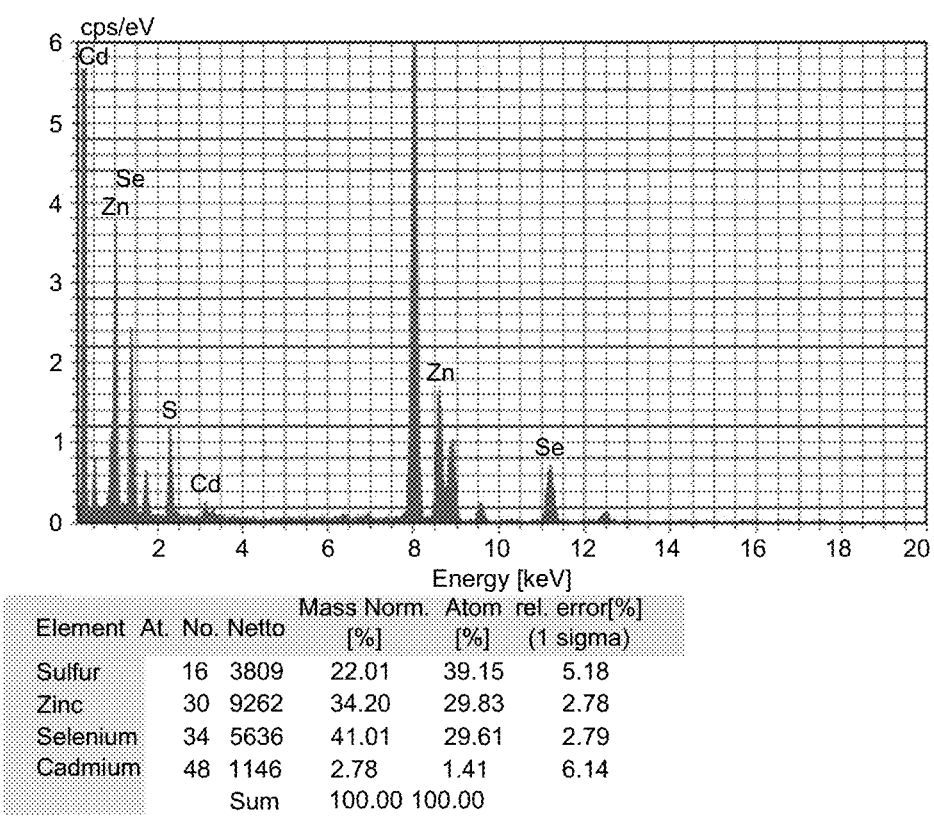
Figure 4C:
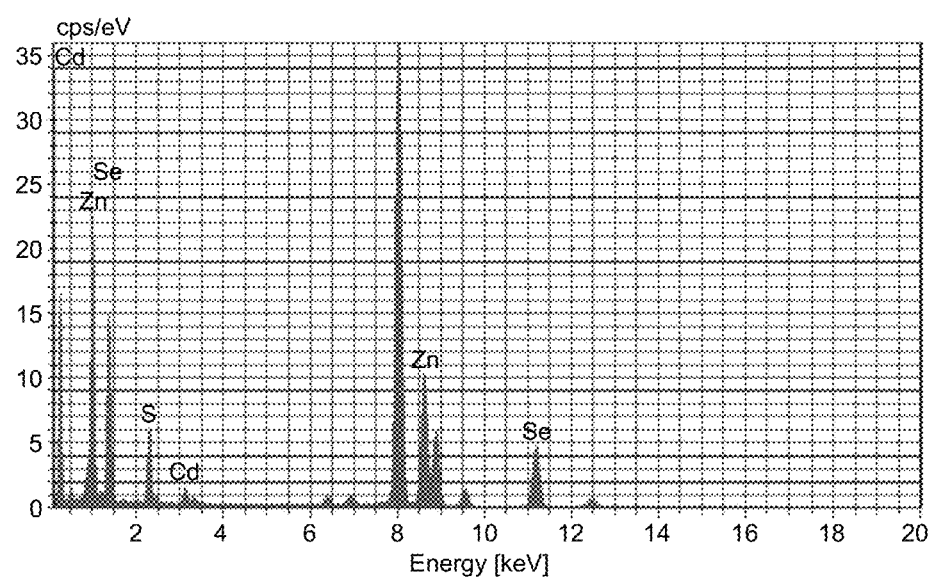
Figure 5:
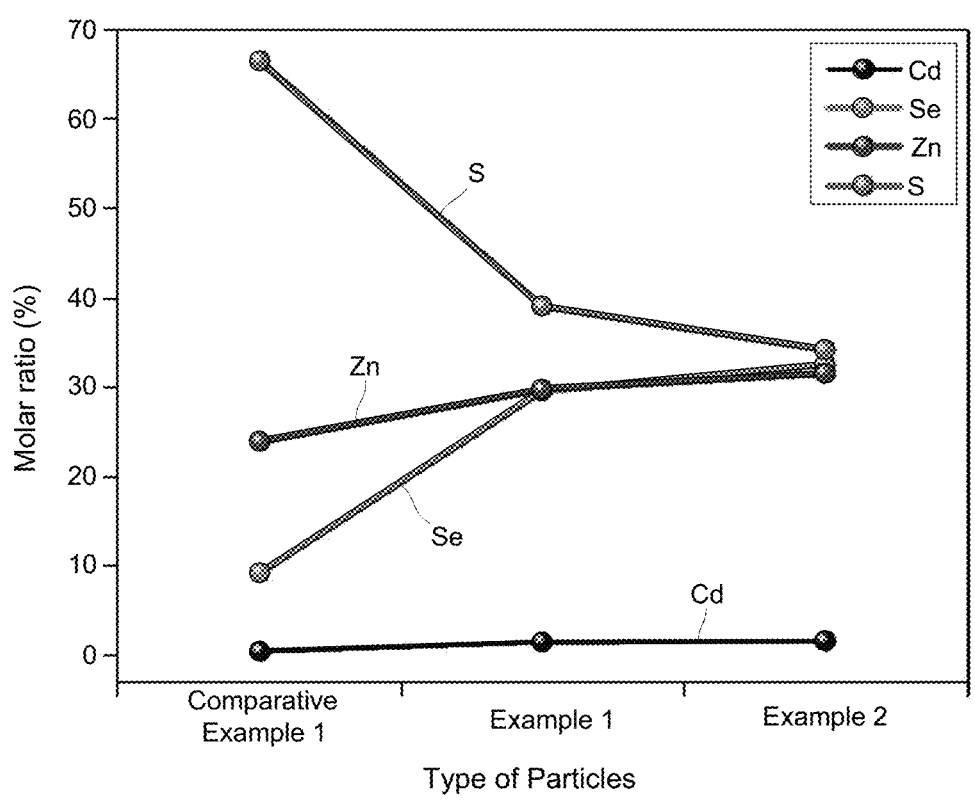
FIG. 5 is a diagram showing the molar ratio (%) of elements in the overall light-emitting quantum dot according to Comparative Example 1 and the overall core-shell type light-emitting quantum dots according to Examples 1 and 2 of the present disclosure, respectively.

In addition, the above-mentioned light-emitting quantum dots were analyzed by energy-dispersive X-ray spectroscopy (EDS). FIGS. 4A to 4C showed the element composition of the light-emitting quantum dot of Comparative Example 1 and the core-shell type light-emitting quantum dots of Examples 1 and 2, respectively. FIG. 5 showed the molar ratio of cadmium (black mark), selenium (red mark), zinc (blue mark), and sulfur (green mark) of the light-emitting quantum dot of Comparative Example 1 and the core-shell type light-emitting quantum dots of Examples 1 and 2. In the core-shell type light-emitting quantum dots of Examples 1 and 2, due to the presence of the second shell layer, the molar ratios of selenium and zinc were increased, and the molar ratio of sulfur was decreased.

Figure 6:
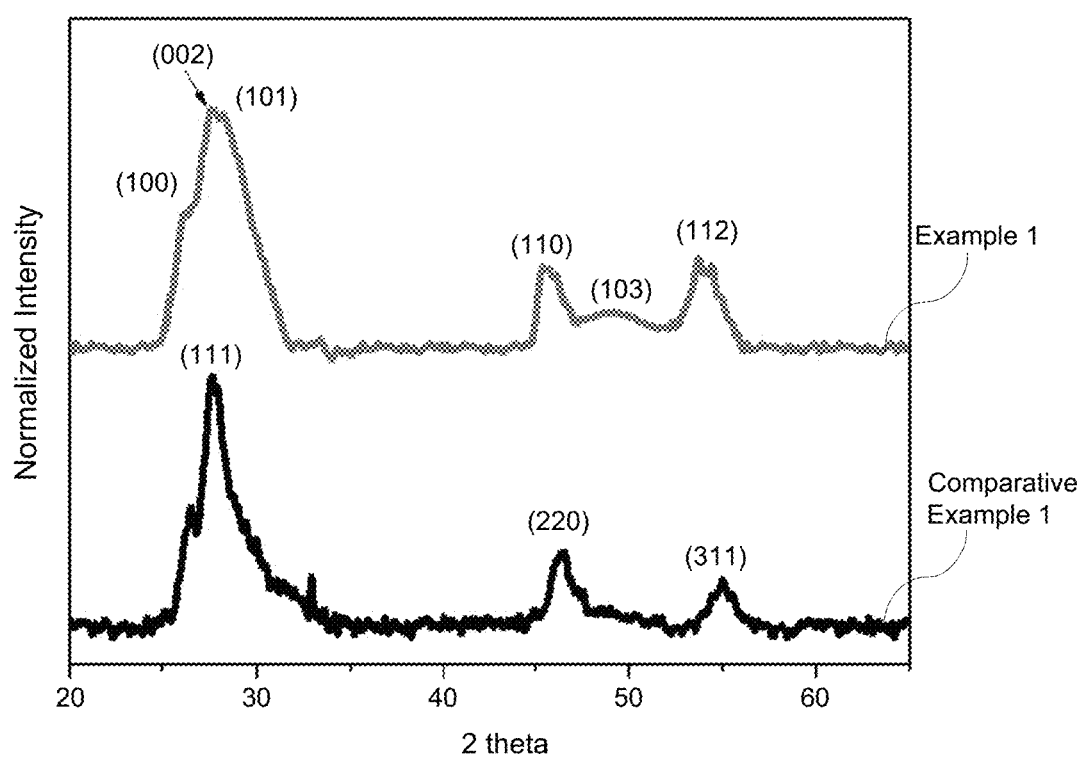
FIG. 6 shows an X-ray diffraction (XRD) pattern of the light-emitting quantum dot according to Comparative Example 1 and the core-shell type light-emitting quantum dot according to Example 1 of the present disclosure, which are analyzed by X-ray diffractometry (XRD)

The light-emitting quantum dot of Comparative Example 1 and the core-shell type light-emitting quantum dots of Example 1 were further analyzed by an X-ray diffractometry (XRD). As shown in FIG. 6, the light-emitting quantum dot of Comparative Example 1 has a zinc blende structure, and the core-shell type light-emitting quantum dots of Example 1 has a wurtzite structure.

Figure 7A:
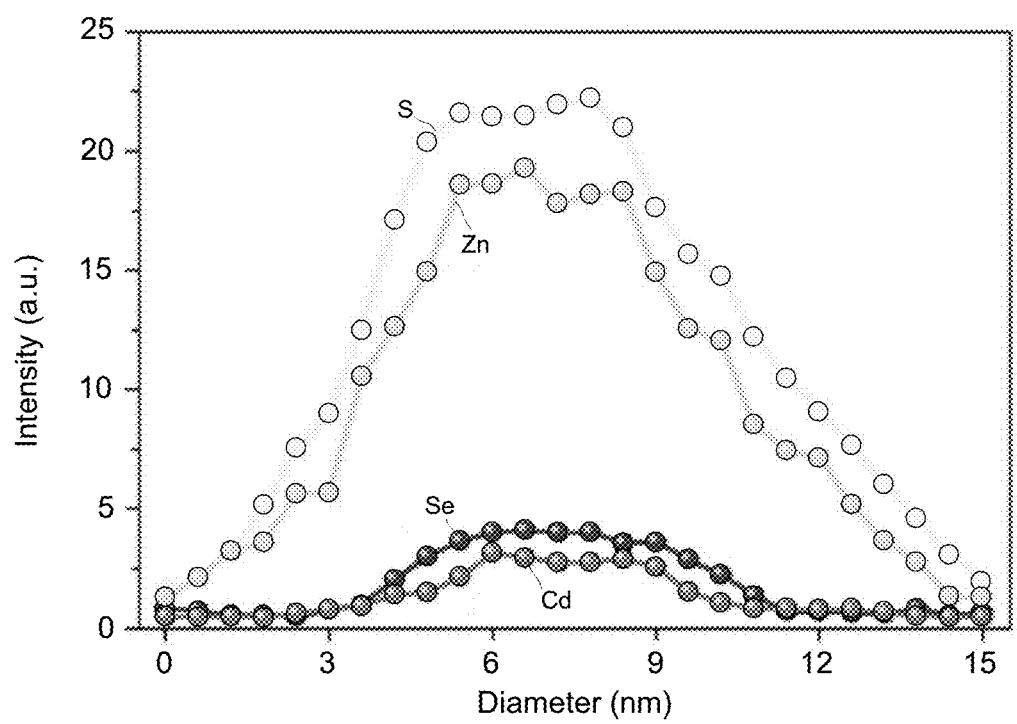
FIGS. 7A and 7B are diagrams showing line scanning of the light-emitting quantum dot according to Comparative Example 1 and the core-shell type light-emitting quantum dot according to Example 1 of the present disclosure, respectively, which are elemental mappings analyzed by energy dispersive spectroscopy (EDS)
Figure 7B:
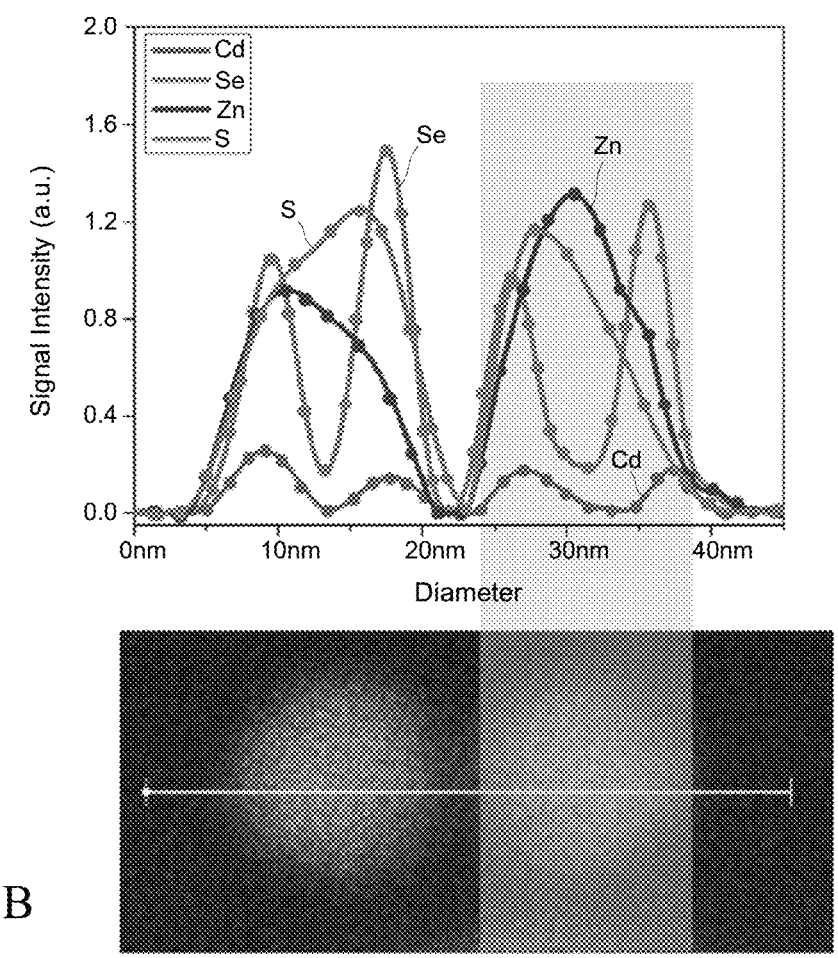
Figure 8A:
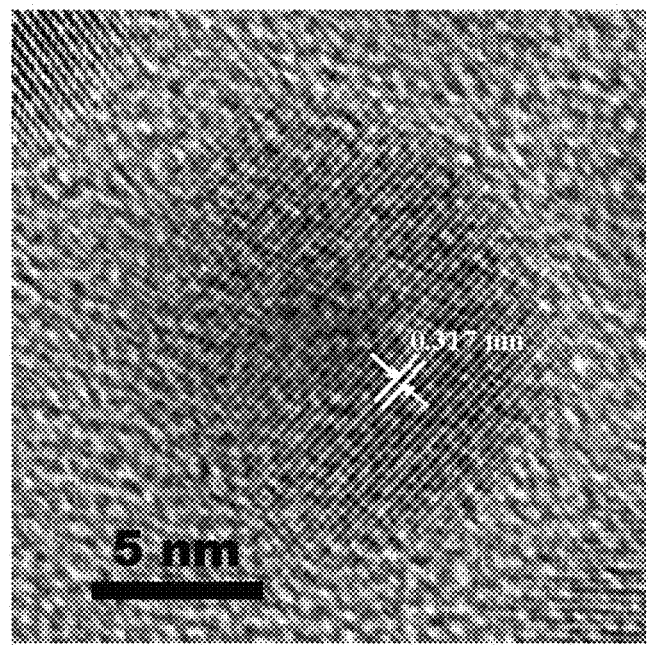
FIGS. 8A and 8B show images of the light-emitting quantum dot according to Comparative Example 1 and the core-shell type light-emitting quantum dot according to Example 1 of the present disclosure, respectively, which are observed by a high-resolution transmission electron microscope (HRTEM)
Figure 8B:
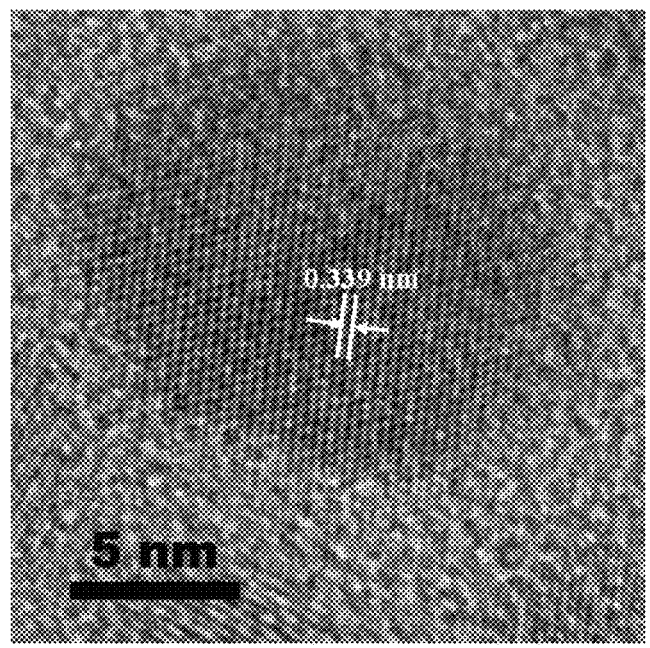

The composition distribution of the light-emitting quantum dot of Comparative Example 1 and the core-shell type light-emitting quantum dot of Example 1 were analyzed by X-ray diffractometry (XRD). In addition, the light-emitting quantum dot of Comparative Example 1 and the core-shell type light-emitting quantum dots of Example 1 were observed by a high-resolution transmission electron microscope (HRTEM). Referring to FIG. 7A, cadmium, selenium, zinc, and sulfur in the light-emitting quantum dot of Comparative Example 1 were gaussian distribution. As shown in FIGS. 7B, 8A, and 8B, a second shell layer having a wurtzite structure and consisting of Cd, Se, Zn, and S was indeed formed on the surface of the first shell layer consisting of ZnS.

Figure 9:
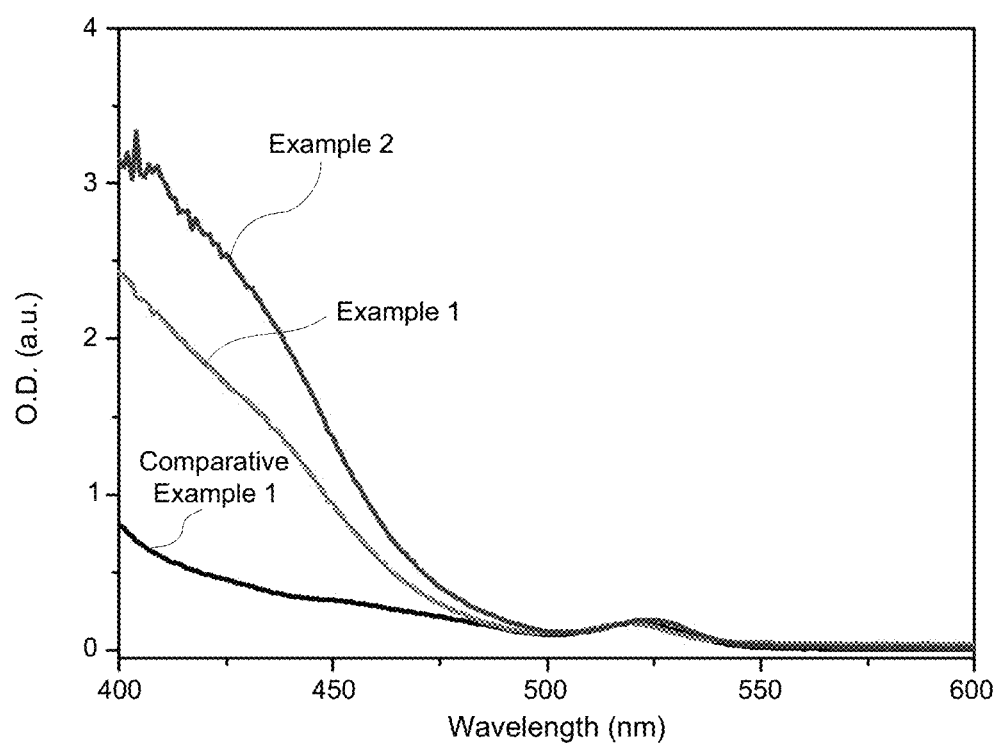
FIG. 9 is a diagram showing the absorbance of the light-emitting quantum dot according to Comparative Example 1 and the core-shell type light-emitting quantum dots according to Examples 1 and 2 of the present disclosure, respectively, which are determined by a Ultraviolet-Visible (UV-Vis) absorption spectroscopy at a wavelength between 400 to 600 nm.
Figure 11:
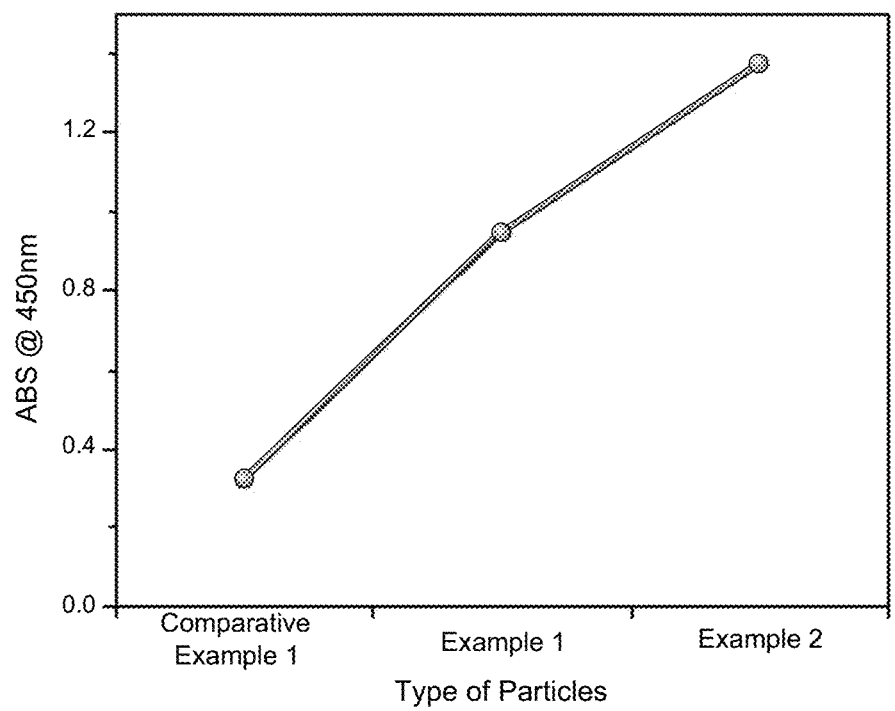
FIG. 11 is a diagram showing the absorbance at a wavelength 450 nm of the light-emitting quantum dot according to Comparative Example 1 and the core-shell type light-emitting quantum dots according to Example 1 and 2 of the present disclosure, respectively, which are determined by a spectrophotometry at a wavelength between 400 to 600 nm.

The absorbance (i.e., optical density, O.D.) of the above-mentioned light-emitting quantum dots was determined by a Ultraviolet-Visible (UV-Vis) spectroscopy. As shown in FIGS. 9 and 11, the absorbance of the core-shell type light-emitting quantum dots coated with at least one second shell layer at a wavelength between 400 to 470 nm was higher than the absorbance of the light-emitting quantum dots including an alloy core and a shell layer with zinc blende structure.

Figure 10:
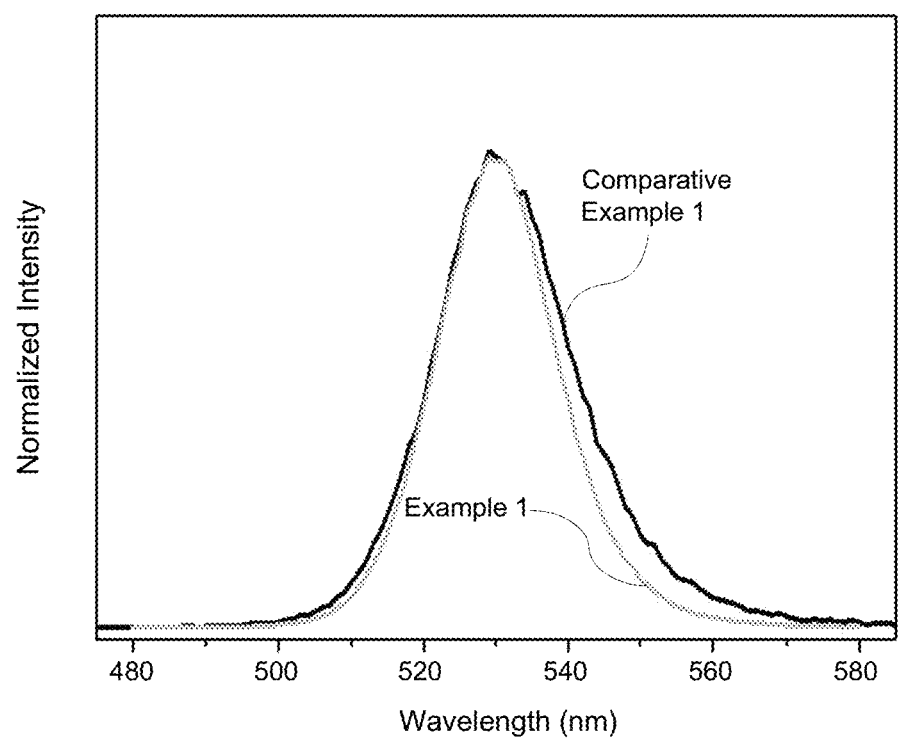
FIG. 10 is a diagram showing the full width at half maximum (FWHM) of the light-emitting quantum dot according to Comparative Example 1 and the core-shell type light-emitting quantum dot according to Example 1 of the present disclosure, which are determined by the results of photoluminescence spectroscopy thereof, respectively.

Referring to FIG. 10, the light-emitting quantum dot of Comparative Example 1 exhibits the full width at half maximum (FWHM) of emission of 22 nm, and the core-shell type light-emitting quantum dot of Example 1 exhibits the FWHM of emission of 19 nm. The decrease in the FWHM indicates the improved color performance and the luminous color purity of the quantum dot in subsequent applications.

Optical films containing the above-mentioned light-emitting quantum dots were prepared for the following intensity measurements.

Figure 12:
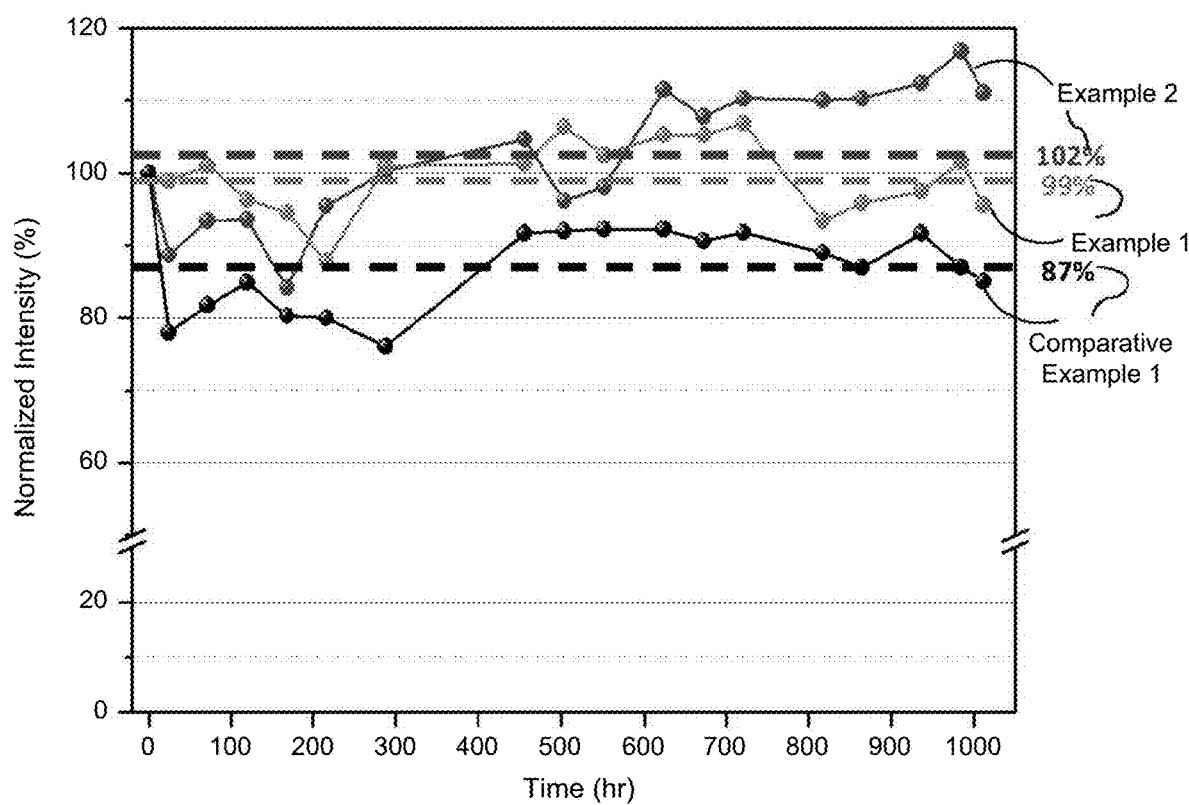
FIG. 12 shows the normalized intensity of the optical films prepared from the light-emitting quantum dot according to Comparative Example 1 and the core-shell type light-emitting quantum dots according to Example 1 and 2 of the present disclosure, respectively, which are measured under a relative humidity of 65% and a temperature of 90° C. for 1000 hours.
Figure 13:
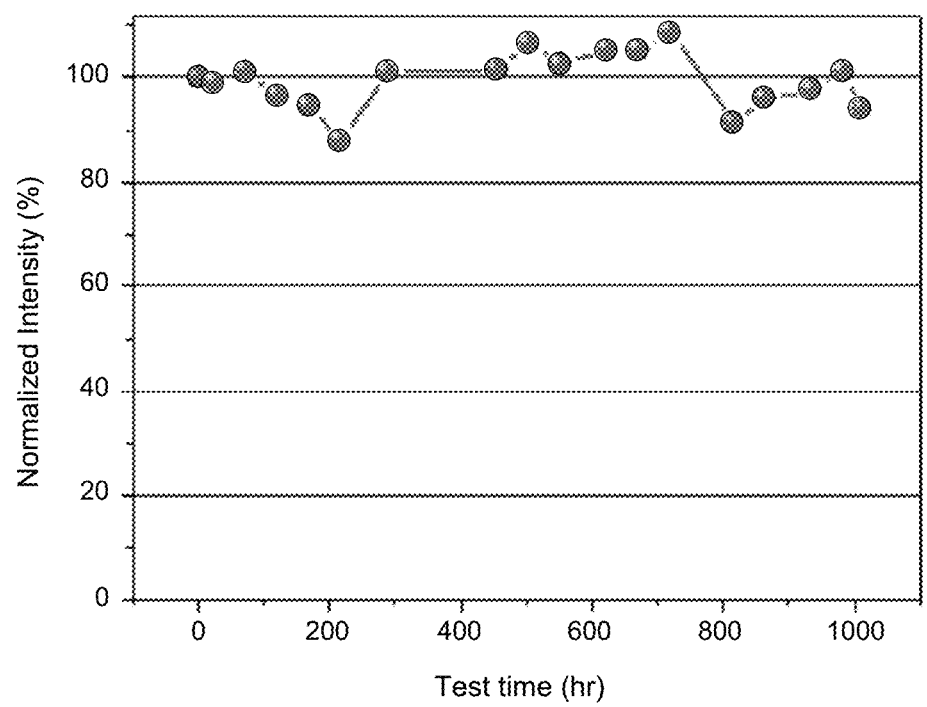
FIGS. 13 and 14 show the normalized intensity of the green optical film and red optical film, respectively, which are prepared from the core-shell type light-emitting quantum dots according to Example 1 of the present disclosure. The intensity is measured under a relative humidity of 65% and a temperature of 90° C. for 1000 hours.
Figure 14:
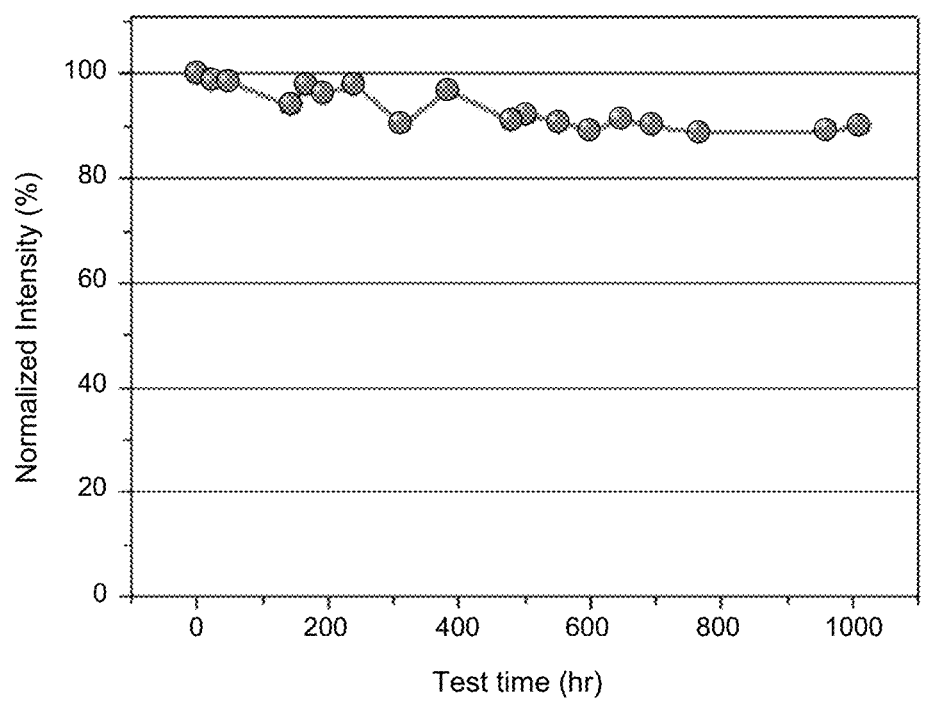

The intensity of the optical films prepared from the light-emitting quantum dot according to Comparative Example 1 and the core-shell type light-emitting quantum dots according to Examples 1 and 2 of the present disclosure were determined under the condition of a relative humidity of 65% and a temperature of 90° C. for 1000 hours. Further, the intensity of the green optical film and the red optical film prepared from the core-shell type light-emitting quantum dots according to Example 1 were determined under the same condition. As shown in FIGS. 12-14, the normalized intensity of the core-shell type light-emitting quantum dots coated with at least one second shell layer (i.e., Examples 1 and 2) remained at least 99% after 1000 hours in the high temperature and high relative humidity environment.

A green thin shell quantum dot from the prior art, the light-emitting quantum dot according to Comparative Example 1, and the core-shell type light-emitting quantum dots according to Example 1 were further prepared into light-emitting diodes, respectively. The structure of the light-emitting diodes was sequentially a layer of indium tin oxide glass, a layer of ZnMgO in a thickness of about 40 nm, a layer of quantum dots, a layer of tris(4-carbazoyl-9-ylphenyl)amine (TCTA) in a thickness of about 70 nm, a layer of MnOx in a thickness of about 10 nm, and a layer of Al in a thickness of about 100 nm. The luminance-voltage curve, the external quantum efficiency (EQE)-voltage curve, and the EQE-luminance curve of light-emitting diodes prepared from green thin shell quantum dot of the prior art (green mark), green quantum dot according to Comparative Example 1 (red mark), and green core-shell type light-emitting quantum dots according to Example 1 (blue mark) of the present disclosure were shown in FIGS. 15-17, respectively.

In addition, the properties of the aforementioned light-emitting diodes were listed in Table 1 below.

TABLE 1

| source of quantum dots | maximum luminance (cd/m$^2$) | maximum current efficiency (cd/A) | maximum power efficiency (lm/W) | maximum EQE (%) | electroluminescence (nm) | FWFH (nm) |
| --- | --- | --- | --- | --- | --- | --- |
| green thin shell quantum dot | 66561 | 22.8 | 8.2 | 4.5 | 530 | 32 |
| Comparative Example 1 | 82335 | 41.5 | 17.1 | 9.4 | 532 | 22 |
| Example 1 | 146395 | 51.8 | 24.3 | 11.2 | 528 | 21 |

Figure 15:
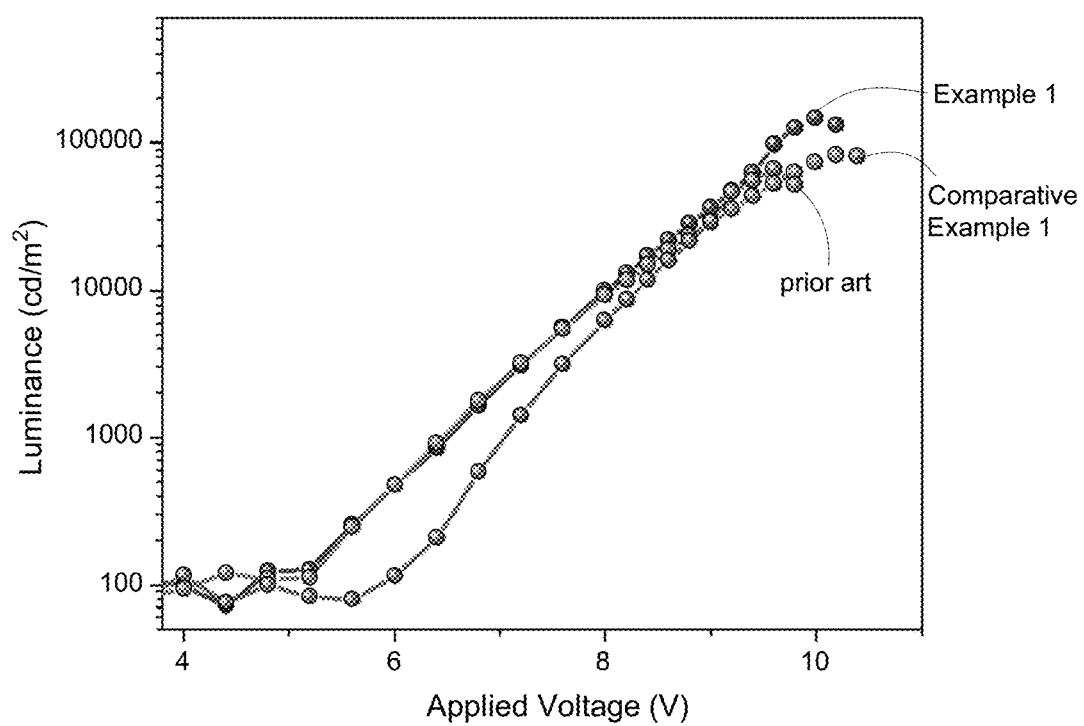
FIG. 15 is a luminance-voltage curve of light-emitting diodes prepared from green thin shell quantum dot of the prior art, green quantum dot according to Comparative Example 1, and green core-shell type light-emitting quantum dots according to Example 1 of the present disclosure, respectively.
Figure 16:
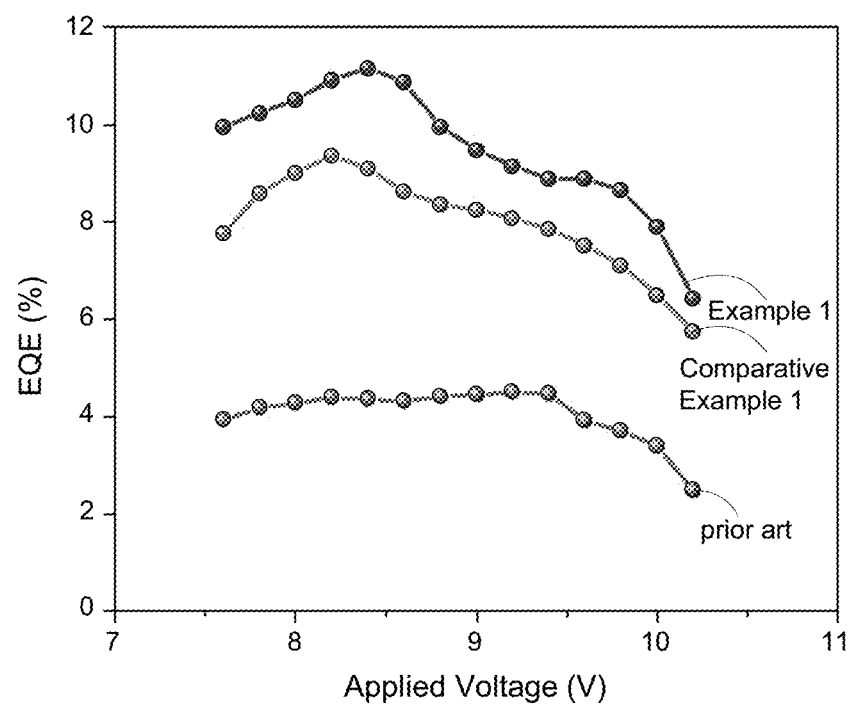
FIG. 16 is an external quantum efficiency (EQE)-voltage curve of light-emitting diodes prepared from green thin shell quantum dot of the prior art, green quantum dot according to Comparative Example 1, and green core-shell type light-emitting quantum dots according to Example 1 of the present disclosure, respectively.
Figure 17:
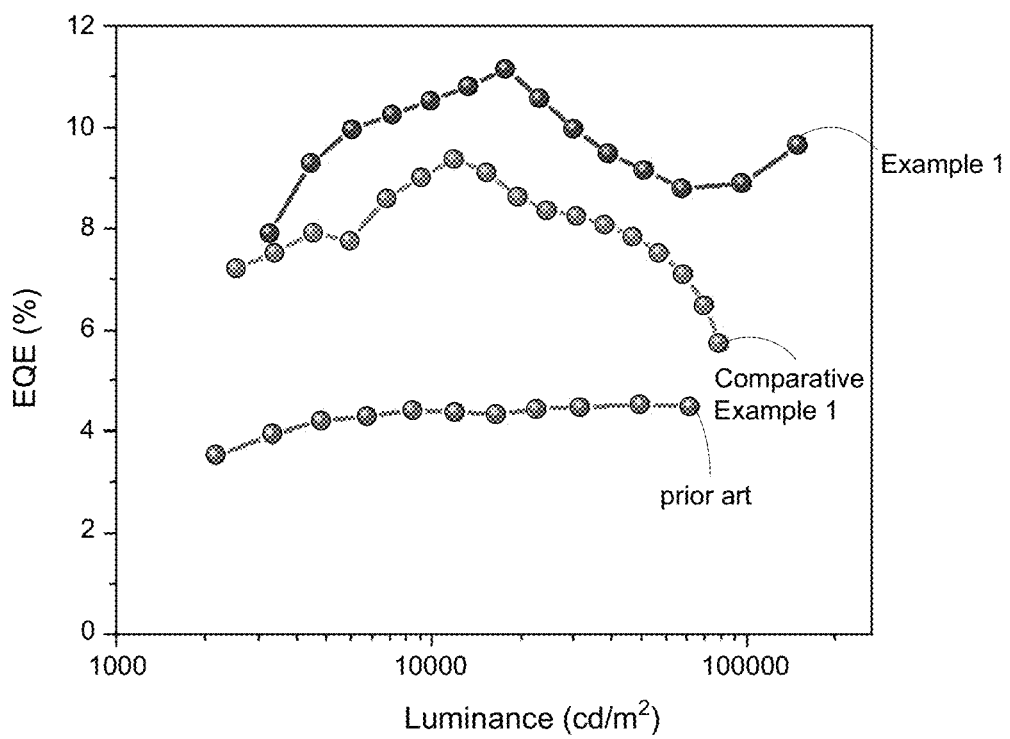
FIG. 17 is an EQE-luminance curve of light-emitting diodes prepared from green thin shell quantum dot of the prior art, green quantum dot according to Comparative Example 1, and green core-shell type light-emitting quantum dots according to Example 1 of the present disclosure, respectively.

As can be seen in FIGS. 15-17 and Table 1, the core-shell type light-emitting quantum dots coated with at least one second shell layer having a wurtzite structure and consisting of Cd, Se, Zn, and S exhibit improved optical properties in the light emission.

Given the foregoing, the preparation method described in the present disclosure may provide a core-shell type light-emitting quantum dot with a shell layer having a wurtzite structure and consisting of Cd, Se, Zn, and S, which provides effective protection to the alloy core, improving the stability of the core-shell type light-emitting quantum dot and prolonging its service life.

Moreover, the core-shell type light-emitting quantum dot having the second shell layer with wurtzite structure may increase the absorbance of blue light and has high-temperature resistance and excellent water- and oxygen-barrier performance.

By the combination of the alloy core with the shell layer having a zinc blende structure, the obtained core-shell type light-emitting quantum dot may achieve a quantum efficiency of 95%, such that the required power consumption is reduced, and the energy-saving effect is obvious. Therefore, the core-shell type light-emitting quantum dot is suitable for industrial application.

The above embodiments are merely illustrative and are not intended to limit the present disclosure. Those skilled in the art can modify and change the above embodiments without departing from the spirit and scope of the present disclosure. Therefore, the scope of the present disclosure is defined by the claims attached to the present disclosure. As long as the effect and implementation purpose of the present disclosure is not affected, it should be covered in this disclosed technical content.

What is claimed is:

1. A core-shell type light-emitting quantum dot, comprising:
    an alloy core consisting of Cd, Se, Zn, and S and having an element ratio of Zn and S each accounting for 30% to 50% of the alloy core, with a content of Cd and Se gradually decreasing outward from a center of the alloy core;
    a first shell layer having a zinc blende structure and being coated on a surface of the alloy core, wherein the first shell layer consists of ZnS; and
    at least one second shell layer having a wurtzite structure and being coated on a surface of the first shell layer,
    wherein the core-shell type light-emitting quantum dot has a D90 particle size of from 16 to 18 nm, and wherein the alloy core has a radius of 3 nm or less.

2. The core-shell type light-emitting quantum dot of claim 1, wherein the at least one second shell layer consists of Cd, Se, Zn, and S.

3. The core-shell type light-emitting quantum dot of claim 1, which has an element ratio of Zn and Se each accounting for 25% to 40% of the core-shell type light-emitting quantum dot, an element ratio of S accounting for 30% to 50% of the core-shell type light-emitting quantum dot, and an element ration of Cd accounting for 0.3% to 5% of the core-shell type light-emitting quantum dot.

4. The core-shell type light-emitting quantum dot of claim 1, which has an element ratio of Cd and Se each accounting for 3% to 10% of the alloy core.

5. A method for preparing the core-shell type light-emitting quantum dot of claim 1, comprising:
    providing a first metal precursor solution containing a Cd metal precursor and a Zn metal precursor and activated by a reactive amine;
    mixing and reacting a first ion stock solution containing S ions and Se ions with the activated metal precursor solution containing the Cd metal precursor and the Zn metal precursor to obtain a solution containing an alloy core;
    adding a second ion stock solution containing S ions and a zinc salt to the solution containing the alloy core for a reaction of forming a first shell layer coated on a surface of the alloy core;
    adding a second metal precursor solution containing a Cd metal precursor and a Zn metal precursor to the solution containing the alloy core coated with the first shell layer;
    mixing and reacting a third ion stock solution containing Se ions with the solution containing the alloy core coated with the first shell layer and the second metal precursor; and
    adding dodecanethiol to the solution containing the third ion stock solution to form a second shell layer coated on a surface of the first shell layer.

6. The method of claim 5, wherein the activated first metal precursor solution containing the Cd metal precursor and the Zn metal precursor is prepared by a process comprising activating the Cd metal precursor by the reactive amine and a reactive acid.

7. The method of claim 6, wherein the process further comprises:
    providing a first metal precursor solution containing the Cd metal precursor, wherein the Cd metal precursor is activated in the first metal precursor solution containing the Cd metal precursor by the reactive amine and the reactive acid; and
    adding the Zn metal precursor to the activated first metal precursor solution containing the Cd metal precursor to activate the Zn metal precursor at a temperature of from 300° C. to 320° C.

8. The method of claim 6, wherein the process further comprises:

providing the first metal precursor solution containing the Cd metal precursor and the Zn metal precursor, wherein the Cd metal precursor is activated in the first metal precursor solution containing the Cd metal precursor and the Zn metal precursor by the reactive amine and the reactive acid; and heating the activated first metal precursor solution containing the Cd metal precursor and the Zn metal precursor to a temperature of from 300° C. to 320° C. to activate the Zn metal precursor.

9. The method of claim 6, wherein the reactive acid is oleic acid, the reactive amine is a primary amine, and wherein the reactive amine and the reactive acid have a molar ratio of from 1:7 to 1:7.5.

10. The method of claim 5, wherein the process further comprises:

activating the Cd metal precursor and the Zn metal precursor in the second metal precursor solution by heating to a temperature of from 180° C. to 240° C. for 10 to 30 minutes, and wherein the second metal precursor solution further contains oleic acid, and the Cd metal precursor and the Zn metal precursor are dissolved in oleic acid.

11. The method of claim 10, wherein the activated second metal precursor solution is heated to a temperature of 270° C. to 310° C. before mixing the third ion stock solution.

12. The method of claim 10, wherein a nitrogen purge process utilizing $N_2$ is performed during the activation of the Cd metal precursor and the Zn metal precursor.

13. The method of claim 9, wherein the primary amine is selected from a group consisting of oleylamine, hexaadecanamine, pentadecylamine, and dodecylamine.

14. The method of claim 5, wherein the solution containing the alloy core is obtained at a reaction temperature of from 280° C. to 310° C. for 10 to 20 minutes.

15. The method of claim 14, wherein adding the second ion stock solution containing the S ions and the zinc salt further comprises:

adding the second ion stock solution containing the S ions to the solution containing the alloy core for 15 to 20 minutes; and adding the zinc salt to react for 20 to 30 minutes.

16. The method of claim 5, wherein the zinc salt is zinc oleate.

17. The method of claim 5, wherein the first shell layer is formed at a reaction temperature of from 240° C. to 270° C., and wherein the second shell layer is formed at a reaction temperature of 270° C. to 310° C.

18. The method of claim 5, wherein the reactive amine, the Cd metal precursor, and the Zn metal precursor for forming the alloy core coated with the first shell layer are in a molar ratio of from 3:0.14:5.9 to 3:1:5.9.

19. The method of claim 5, wherein the Cd metal precursor, the Zn metal precursor, the S ions and the Se ions for obtaining the solution containing an alloy core are in a molar ratio of from 0.14:5.9:4.2:1.5 to 1:5.9:4.2:1.5, and wherein the Cd metal precursor, the Zn metal precursor, the dodecanethiol, and the Se ions for forming the second shell layer are in a molar ratio of from 0.65:5.4:50:24 to 1.3:10.8:70:48.

* * * * *